United States Patent
Cheng et al.

(10) Patent No.: US 9,448,585 B2
(45) Date of Patent: Sep. 20, 2016

(54) CLAMPING STRUCTURE, ELECTRONIC DEVICE AND CLAMPING COMPONENT

(71) Applicant: Wistron Corporation, New Taipei (TW)

(72) Inventors: Jui-Kai Cheng, New Taipei (TW); Chia-Lin Yu, New Taipei (TW); Ju-Ching Lin, New Taipei (TW); Ya-Jiun Tzeng, New Taipei (TW); Chu-Ting Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 14/325,384

(22) Filed: Jul. 8, 2014

(65) Prior Publication Data

US 2015/0245521 A1   Aug. 27, 2015

(30) Foreign Application Priority Data

Feb. 26, 2014   (TW) .............................. 103106512 A

(51) Int. Cl.
| | |
|---|---|
| *H05K 5/06* | (2006.01) |
| *G06F 1/16* | (2006.01) |
| *H05K 5/02* | (2006.01) |
| *H05K 5/00* | (2006.01) |
| *H05K 5/03* | (2006.01) |

(52) U.S. Cl.
CPC ............ *G06F 1/1613* (2013.01); *H05K 5/0013* (2013.01); *H05K 5/0086* (2013.01); *H05K 5/0217* (2013.01); *H05K 5/0221* (2013.01); *H05K 5/03* (2013.01); *H05K 5/06* (2013.01); *Y10T 403/52* (2015.01)

(58) Field of Classification Search
CPC ........ H05K 5/06; H05K 5/0013; H05K 5/03; H05K 5/0217; H05K 5/0086; H05K 5/0221
See application file for complete search history.

(56) References Cited

U.S. PATENT DOCUMENTS

| | | | |
|---|---|---|---|
| 8,763,832 B2 | 7/2014 | Yeh et al. | |
| 2013/0271902 A1* | 10/2013 | Lai | .......................... H04R 1/02 361/679.01 |
| 2013/0314867 A1* | 11/2013 | Liu | .......................... F16B 2/22 361/679.26 |

FOREIGN PATENT DOCUMENTS

| | | |
|---|---|---|
| JP | 2012156336 | 8/2012 |
| TW | 385839 | 3/2000 |
| TW | M241535 | 8/2004 |
| TW | M354779 | 4/2009 |
| TW | M400603 | 3/2011 |

OTHER PUBLICATIONS

Office Action of Taiwan Counterpart Application, with partial English translation, issued on Nov. 25, 2015, p. 1-p. 13, in which the listed references were cited.
Office Action of China Counterpart Application with partial English translation, issued on Jul. 13, 2016, p. 1-p. 31.

* cited by examiner

*Primary Examiner* — Ermias Woldegeorgis
(74) *Attorney, Agent, or Firm* — Jianq Chyun IP Office

(57) ABSTRACT

A clamping structure includes an object, a clamping component and an elastic component. The object has a hole and a containing space, wherein the containing space is connected to the hole. The clamping component includes a pillar, a bump and a head portion, wherein the bump and the head portion are connected to the pillar, and the pillar is adapted to be inserted into the hole and rotated such that the bump moves to the containing space. When the bump is located in the containing space, the elastic component is compressed between the object and the head portion, and the bump is positioned at the containing space by elastic force of the elastic component, such that the clamping component is fastened to the object.

34 Claims, 7 Drawing Sheets

CLAMPING STRUCTURE, ELECTRONIC DEVICE AND CLAMPING COMPONENT

CROSS-REFERENCE TO RELATED APPLICATION

This application claims the priority benefit of Taiwan application Ser. No. 103106512, filed on Feb. 26, 2014. The entirety of the above-mentioned patent application is hereby incorporated by reference herein and made a part of this specification.

BACKGROUND

1. Field of the Disclosure

The disclosure relates to a clamping structure, an electronic device and a clamping component, and more particularly, to a clamping structure, an electronic device and a clamping component having waterproof functions.

2. Description of Related Art

With advancements in technology, people have increasing reliance on electronic devices. Modern users usually require the electronic devices to include features such as high computational performance as well as a light, thin and compact size. Accordingly, various portable electronic devices, such as notebook computers, tablet PCs and smartphones, have become popular in the consumer market.

To enable their waterproof functions, some portable electronic devices have a casing assembled by use of waterproof screws. A conventional waterproof screw has a surface of the screw coated with a waterproof material. Accordingly, after the screw is fastened to the casing, the waterproof material between the screw and the casing prevents outside liquid from entering the portable electronic device. However, the aforementioned waterproof material easily wears due to repeated fastening of the screw, causing reduction in its waterproof performance. In addition, to enable the screw to be fastened to the casing of the portable electronic device, it is generally required that a threaded post be disposed on the casing by thermal melting for fastening the screw thereto, and this will increase manufacturing costs of the portable electronic device.

SUMMARY OF THE DISCLOSURE

The disclosure provides a clamping structure, an electronic device and a clamping component having good waterproof performance and reduced manufacturing costs.

The clamping structure of the disclosure includes an object, a clamping component and a waterproof elastic component. The object has a hole and a containing space, wherein the containing space is connected to the hole. The clamping component includes a pillar, a bump and a head portion, wherein the bump and the head portion are connected to the pillar, and the pillar is adapted to be inserted into the hole and rotated such that the bump moves to the containing space. When the bump is located in the containing space, the elastic component is compressed between the object and the head portion, and the bump is positioned at the containing space by elastic force of the elastic component, such that the clamping component is fastened to the object.

In an embodiment of the disclosure, the elastic component is a waterproof elastic component.

In an embodiment of the disclosure, the object has an upper surface and a guide groove. The pillar is adapted to be inserted into the hole from the upper surface, the guide groove extends from the upper surface to the containing space, and the bump is adapted to move to the containing space by guidance of the guide groove.

In an embodiment of the disclosure, the elastic component is fixed to the pillar. When the pillar is inserted into the hole, the elastic component moves onto the object with movement of the pillar.

In an embodiment of the disclosure, the elastic component is adapted to be placed on the object. When the pillar is inserted into the hole, the clamping component compresses the elastic component on the object.

In an embodiment of the disclosure, the object has a containing recessed portion, and the elastic component is adapted to be contained in the containing recessed portion.

In an embodiment of the disclosure, the object has a position-limiting protruding portion. The position-limiting protruding portion is located in the containing recessed portion, and the elastic component is position-limited between an inner wall of the containing recessed portion and the position-limiting protruding portion.

In an embodiment of the disclosure, the object includes a first component and a second component. The first component has a first assembly hole, and the second component has a second assembly hole. The containing space is located at the second component. The first component leans against the second component such that the first assembly hole and the second assembly hole are aligned with each other to form the hole. When the clamping component is fastened to the object, the elastic component is compressed between the first component and the head portion, and the head portion prevents the first component from being separated from the second component.

The electronic device of the disclosure includes a casing, a clamping component and an elastic component. The casing has a hole and a containing space, wherein the containing space is connected to the hole. The clamping component includes a pillar, a bump and a head portion, wherein the bump and the head portion are connected to the pillar, and the pillar is adapted to be inserted into the hole and rotated such that the bump moves to the containing space. When the bump is located in the containing space, the elastic component is compressed between the casing and the head portion, and the bump is positioned at the containing space by elastic force of the elastic component, such that the clamping component is fastened to the casing.

In an embodiment of the disclosure, the elastic component is a waterproof elastic component.

In an embodiment of the disclosure, the casing has an upper surface and a guide groove. The pillar is adapted to be inserted into the hole from the upper surface, the guide groove extends from the upper surface to the containing space, and the bump is adapted to move to the containing space by guidance of the guide groove.

In an embodiment of the disclosure, the guide groove includes a first section and a second section. The first section is connected between the upper surface and the second section and extends along a direction perpendicular to the upper surface, and the second section is connected between the first section and the containing space and extends along a direction parallel to the upper surface.

In an embodiment of the disclosure, the guide groove extends to the containing space along a direction tilted with respect to the upper surface.

In an embodiment of the disclosure, the bump has at least one inclined surface, and the inclined surface is adapted to move along inner walls of the guide groove.

In an embodiment of the disclosure, the containing space has a protrusion therein. When the bump is located in the containing space, the protrusion prevents the bump from leaving from the containing space.

In an embodiment of the disclosure, the elastic component is fixed to the pillar. When the pillar is inserted into the hole, the elastic component moves onto the casing with movement of the pillar.

In an embodiment of the disclosure, the elastic component has a ring shape and surrounds the pillar.

In an embodiment of the disclosure, the pillar has a position-limiting section. An outer diameter of the position-limiting section is smaller than outer diameters of the other sections of the pillar, and the elastic component is position-limited to the position-limiting section.

In an embodiment of the disclosure, the elastic component is adapted to be placed on the casing. When the pillar is inserted into the hole, the clamping component compresses the elastic component on the casing.

In an embodiment of the disclosure, the casing has a containing recessed portion, and the elastic component is adapted to be contained in the containing recessed portion.

In an embodiment of the disclosure, the casing has a position-limiting protruding portion. The position-limiting protruding portion is located in the containing recessed portion, and the elastic component is position-limited between an inner wall of the containing recessed portion and the position-limiting protruding portion.

In an embodiment of the disclosure, a thickness of the elastic component is greater than a thickness of the position-limiting protruding portion.

In an embodiment of the disclosure, a thickness of the elastic component is smaller than a thickness of the position-limiting protruding portion. The clamping component has a protruding edge. The protruding edge and the pillar are connected to the same side of the head portion. When the clamping component is fastened to the casing, the protruding edge extends between the inner wall of the containing recessed portion and the position-limiting protruding portion and compresses the elastic component.

In an embodiment of the disclosure, the clamping component is adapted to be inserted into the hole along a direction parallel to a central axis of the pillar, and rotated around the central axis of the pillar to drive the bump to move to the containing space.

In an embodiment of the disclosure, the casing includes a first component and a second component. The first component has a first assembly hole, and the second component has a second assembly hole. The containing space is located at the second component. The first component leans against the second component such that the first assembly hole and the second assembly hole are aligned with each other to form the hole. When the clamping component is fastened to the casing, the elastic component is compressed between the first component and the head portion, and the head portion prevents the first component from being separated from the second component.

The fixing component of the disclosure includes a pillar, a stopping portion and a positioning bump. The stopping portion is connected to the pillar, wherein an outer diameter of the stopping portion is greater than an outer diameter of the pillar. The positioning bump is connected to the pillar, wherein the fixing component is adapted to be rotated around a central axis of the pillar to change a position of the positioning bump.

In an embodiment of the disclosure, the pillar has a ring-shaped groove. An outer diameter of the ring-shaped groove is smaller than outer diameters of the other sections of the pillar. A waterproof elastic component is adapted to surround the pillar and to be position-limited to the ring-shaped groove.

In an embodiment of the disclosure, the fixing component has a protruding edge, wherein the protruding edge and the pillar are connected to the same side of the stopping portion.

In an embodiment of the disclosure, the stopping portion has a jagged structure, and the jagged structure is adapted to receive a force to drive the fixing component to rotate.

In an embodiment of the disclosure, the pillar is a threadless structure.

In an embodiment of the disclosure, the pillar is a threaded structure.

Based on the above, the elastic component of the disclosure is compressed between the object (such as a casing of an electronic device) and the head portion of the clamping component, such that the outside liquid is prevented by the elastic component from entering the object. Moreover, the bump of the clamping component is positioned at the containing space of the object by elastic force of the elastic component, such that the clamping component is fastened to the object. Accordingly, unlike a conventional waterproof screw, the clamping component of the disclosure does not need to be fastened and positioned by screw locking. Moreover, unlike the conventional waterproof screw, the clamping component of the disclosure does not perform waterproofing by a waterproof material coated on the screw. Therefore, a situation that the waterproof material wears due to repeated fastening of the screw does not occur, and thus the clamping structure has good waterproof performance and improved capability of being assembled repeatedly. In addition, since the clamping component of the disclosure is not assembled by screw locking, there is no need to dispose a threaded post on the object by thermal melting for fastening of the clamping component, thus reducing manufacturing costs of the clamping structure.

To make the above features and advantages of the disclosure more comprehensible, embodiments accompanied with drawings are described in detail as follows.

DETAILED DESCRIPTION OF DISCLOSED EMBODIMENTS

Figure 1:
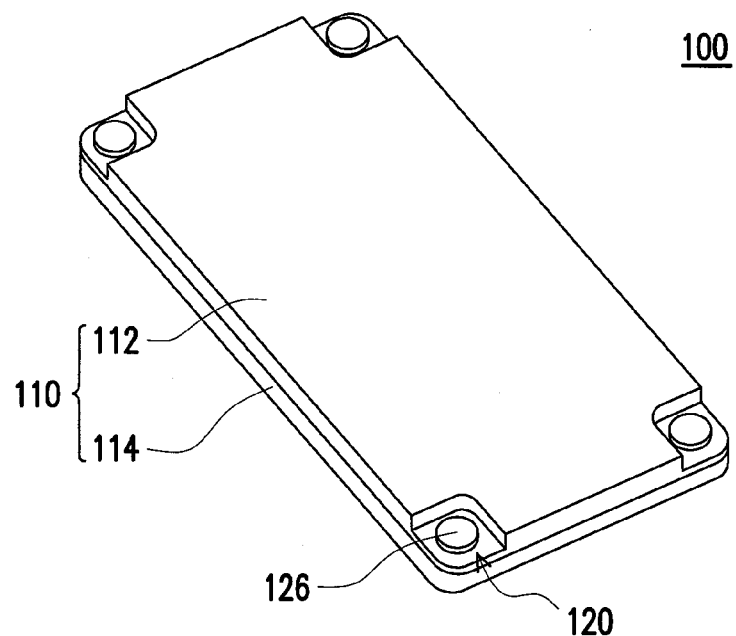
FIG. 1 is a three-dimensional view of a clamping structure according to the first embodiment of the disclosure.
Figure 2:
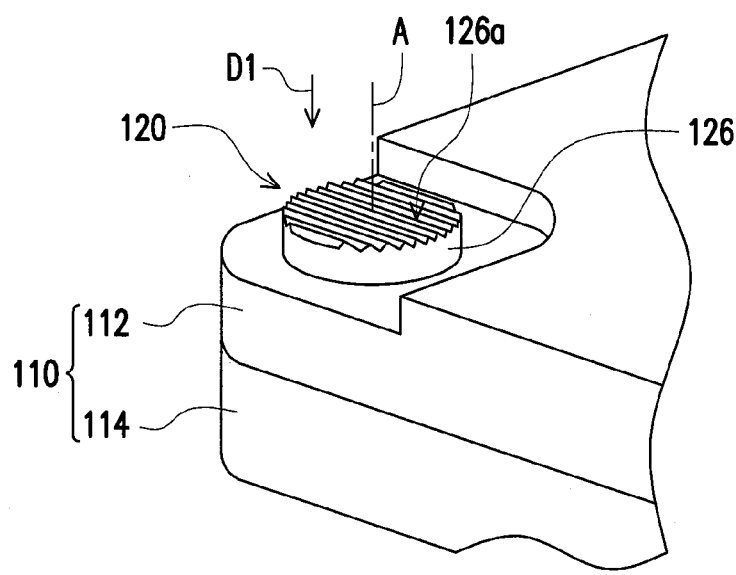
FIG. 2 is a partial enlarged view of the clamping structure in FIG. 1.
Figure 3:
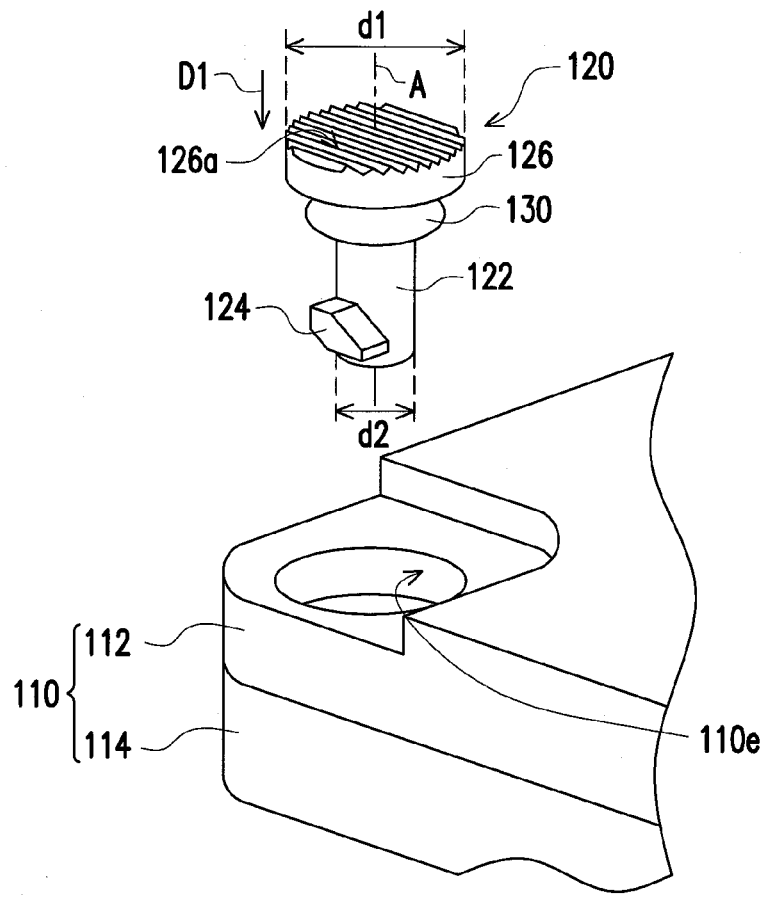
FIG. 3 is a breakdown view of the clamping structure in FIG. 2.

FIG. 1 is a three-dimensional view of a clamping structure according to the first embodiment of the disclosure. FIG. 2 is a partial enlarged view of the clamping structure in FIG. 1. FIG. 3 is a breakdown view of the clamping structure in FIG. 2. Referring to FIGS. 1 to 3, a clamping structure 100 of the present embodiment includes an object 110, four clamping components (also referred to as fixing components) 120, and a waterproof elastic component 130. The clamping structure 100 is, for example, an electronic device or other kinds of structures. The electronic device may be a portable electronic device, such as a notebook computer, a tablet PC, a smartphone, a Global Positioning System (GPS) device, or a digital camera, etc. The object 110 is, for example, a casing of the electronic device, and includes a first component 112 and a second component 114. The first component 112 and the second component 114 are, for example, two outer casings of the electronic device, and are assembled by use of the clamping components 120. Moreover, the object 110 performs waterproofing by means of the waterproof elastic component 130. The details thereof are described as follows.

Figure 4:
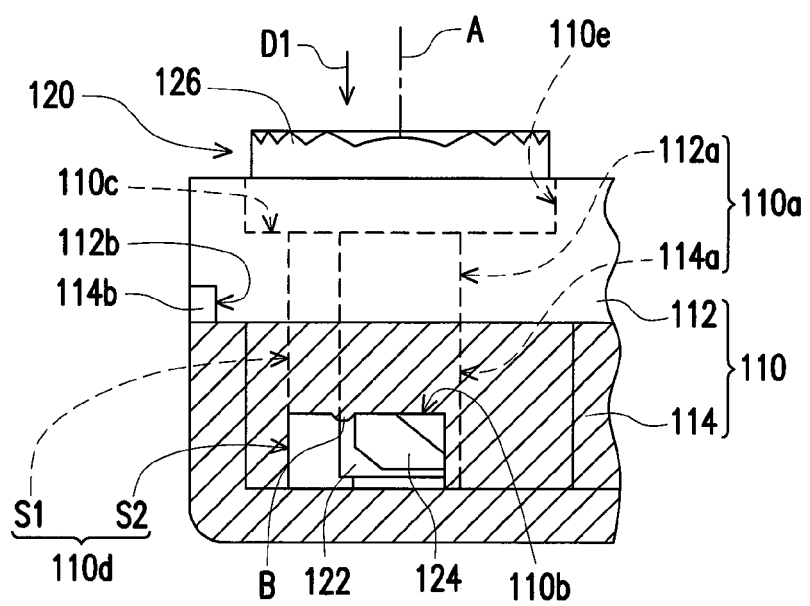
FIG. 4 is a partial sectional view of the clamping structure in FIG. 2.
Figure 5:
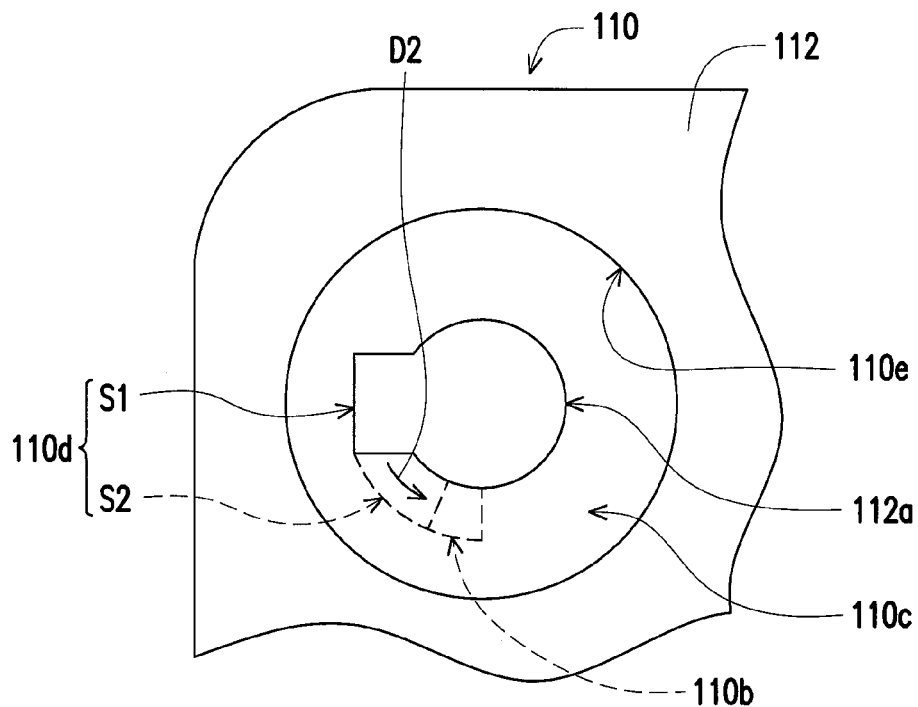
FIG. 5 is a partial top view of the object in FIG. 3.

FIG. 4 is a partial sectional view of the clamping structure in FIG. 2. FIG. 5 is a partial top view of the object in FIG. 3. For clarity of the drawing, FIG. 4 only shows a sectional view of the second component 114 of the object 110, and a part of structural characteristics inside the object 110 which are covered are illustrated in dashed lines. Referring to FIGS. 4 and 5, the first component 112 has a first assembly hole 112a, and the second component 114 has a second assembly hole 114a. As shown in FIG. 4, the first component 112 leans against the second component 114 such that the first assembly hole 112a and the second assembly hole 114a are aligned with each other to form a hole 110a of the object 110, wherein the first component 112, for example, has a recess 112b, the second component 114, for example, has a locking portion 114b, and the locking portion 114b is locked in the recess 112b such that the first component 112 and the second component 114 are positioned by each other. The object 110 further has a containing space 110b, wherein the containing space 110b is located at the second component 114 and connected to the hole 110a. As shown in FIG. 3, the clamping component 120 includes a pillar 122, a bump (also referred to positioning bump) 124 and a head portion (also referred to as stopping portion) 126. The bump 124 and the head portion 126 are connected to the pillar 122, and an outer diameter d1 (denoted in FIG. 3) of the head portion 126 is greater than an outer diameter d2 (denoted in FIG. 3) of the pillar 122.

Figure 6A:
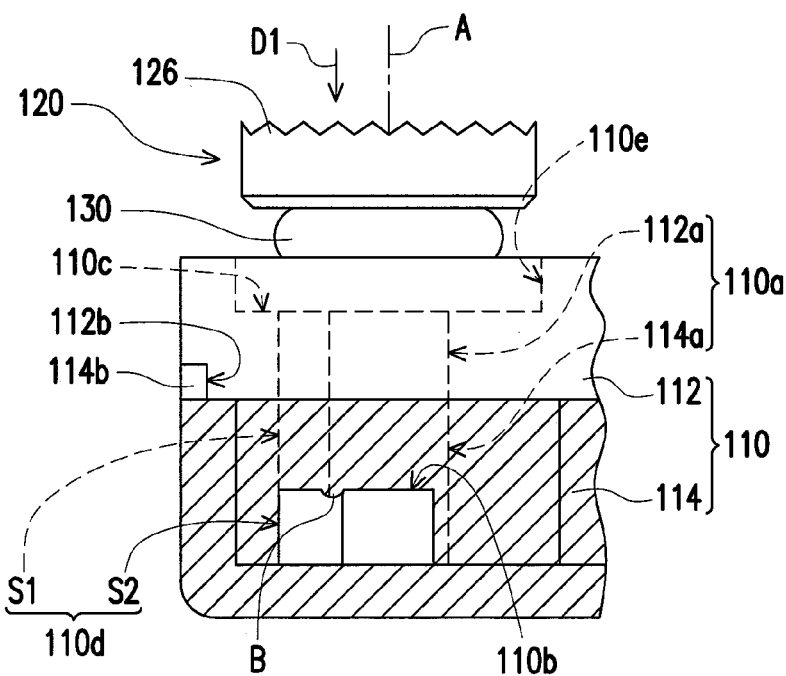
FIGS. 6A and 6B illustrate a process of assembling the clamping structure in FIG. 4.
Figure 6B:
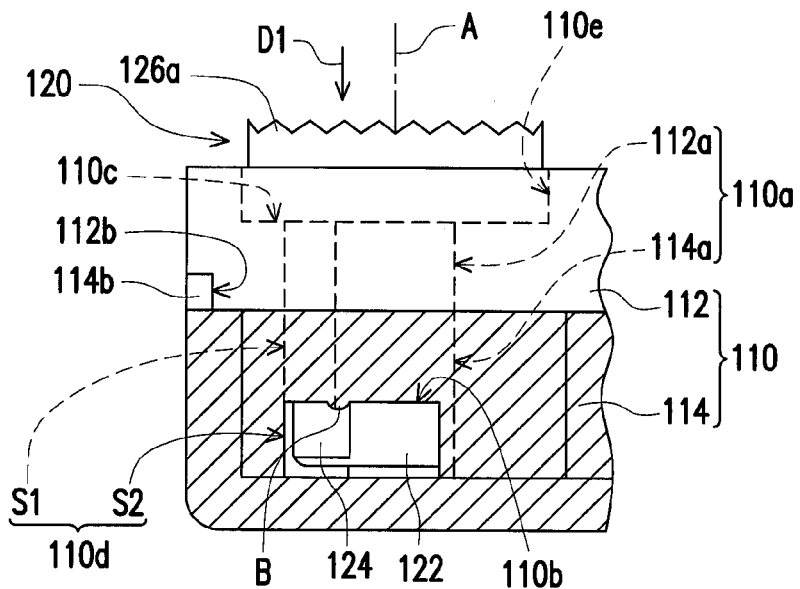
Figure 7:
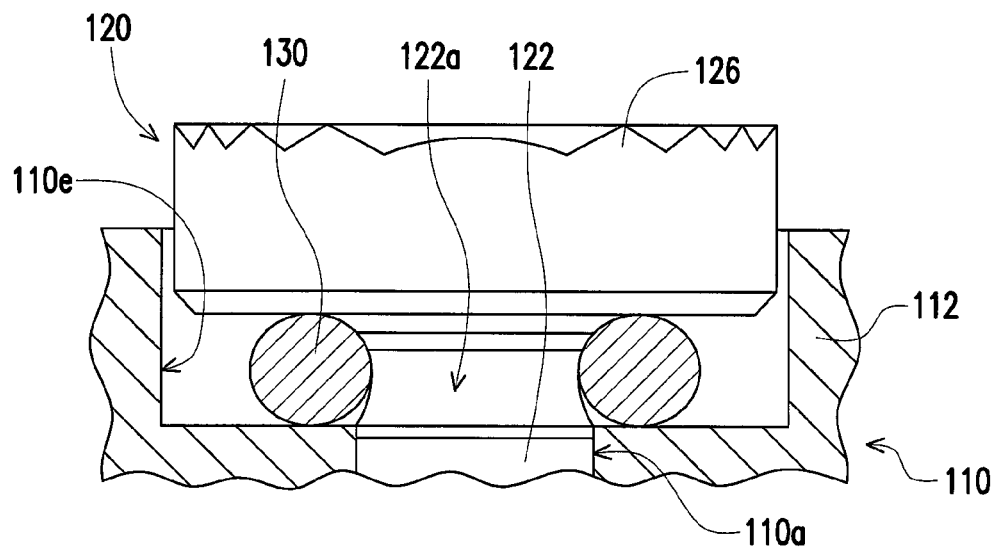
FIG. 7 is a partial sectional view of the clamping structure in FIG. 1.

FIGS. 6A and 6B illustrate a process of assembling the clamping structure in FIG. 4. FIG. 7 is a partial sectional view of the clamping structure in FIG. 1. As shown in FIGS. 6A to 6B, the pillar 122 is adapted to be inserted into the hole 110a along a direction D1 parallel to a central axis A of the pillar 122. Next, the clamping component 120 is rotated around the central axis A of the pillar 122 to change the position of the bump 124, such that the bump 124 moves to the containing space 110b, as shown in FIG. 4. When the bump 124 is located in the containing space 110b, as shown in FIG. 4, the waterproof elastic component 130 is compressed between the first component 112 of the object 110 and the head portion 126, as shown in FIG. 7, thereby using the waterproof elastic component 130 to prevent outside liquid from entering the object 110. In addition, the bump 124 is positioned at the containing space 110b by elastic force of the waterproof elastic component 130, such that the clamping component 120 is fastened to the object 110. At this moment, the head portion 126 prevents the first component 112 from being separated from the second component 114. In addition, the containing space 110b has a protrusion B therein. When the bump 124 is located in the containing space 110b, the protrusion B prevents the bump 124 from leaving from the containing space 110b, such that the clamping component 120 is stably fastened to the object 110.

With the above configuration, the pillar 122 of the clamping component 120 is a threadless structure. Thus, unlike a conventional waterproof screw, the clamping component 120 does not need to be fastened and positioned by screw locking. Moreover, unlike the conventional waterproof screw, the clamping component 120 does not perform waterproofing by a waterproof material coated on the screw. Accordingly, a situation that the waterproof material wears due to repeated fastening of the screw does not occur, and thus the clamping structure 100 has good waterproof performance and improved capability of being assembled repeatedly. In addition, since the clamping component 120 is not assembled by screw locking, there is no need to dispose a threaded post on the object 110 by thermal melting for fastening of the clamping component 120, thus reducing manufacturing costs of the clamping structure 100.

Referring to FIGS. 2 and 3, in the present embodiment, the head portion 126 of the clamping component 120 has a sawtooth structure (also referred to as jagged structure) 126a. When a user intends to rotate the clamping component 120, they may apply force to the sawtooth structure 126a through their fingers, so as to rotate the clamping component 120 by friction between the fingers and the sawtooth structure 126a. There is no need for an additional tool (e.g. screwdriver) for rotating the clamping component 120. In other embodiments, the head portion 126 of the clamping component 120 may have a surface structure in other suitable forms for the user's fingers to apply force thereon. The disclosure does not impose any limitation on this.

The clamping component 120 of the present embodiment has, for example, an integrally formed structure, and a material thereof is, for example, plastics. A material of the waterproof elastic component 130 is, for example, rubber. However, the disclosure is not limited thereto. In other embodiments, the clamping component and the waterproof elastic component may include other suitable materials.

Referring to FIGS. 4 and 5, in the present embodiment, the object 110 has an upper surface 110c and a guide groove 110d, and the guide groove 110d extends from the upper surface 110c to the containing space 110b. The pillar 122 of the clamping component 120 is adapted to be inserted into the hole 110a from the upper surface 110c of the object 110, and the bump 124 moves to the containing space 110b by guidance of the guide groove 110d. Specifically, the guide groove 110d of the present embodiment includes a first section S1 and a second section S2. The first section S1 is connected between the upper surface 110c and the second section S2, and extends along the direction D1 perpendicular to the upper surface 110c. The second section S2 is connected between the first section Si and the containing space 110b, and extends along a direction D2 (denoted in FIG. 5) parallel to the upper surface 110c. With such configuration, when the user inserts the pillar 122 of the clamping component 120 into the hole 110a of the object 110 along the direction D1, as shown in FIGS. 6A to 6B, with downward movement of the pillar 122, the bump 124 connected to the pillar 122 moves to a position as shown in FIG. 6B along the first section Si of the guide groove 110d. Next, when the user rotates the clamping component 120 around the central axis A of the pillar 122, with rotation of the clamping component 120, the bump 124 of the clamping component 120 moves to the containing space 110b along the direction D2. In other embodiments, the guide groove may have other suitable extension directions, which will be exemplified hereinafter with reference to drawings.

Figure 8:
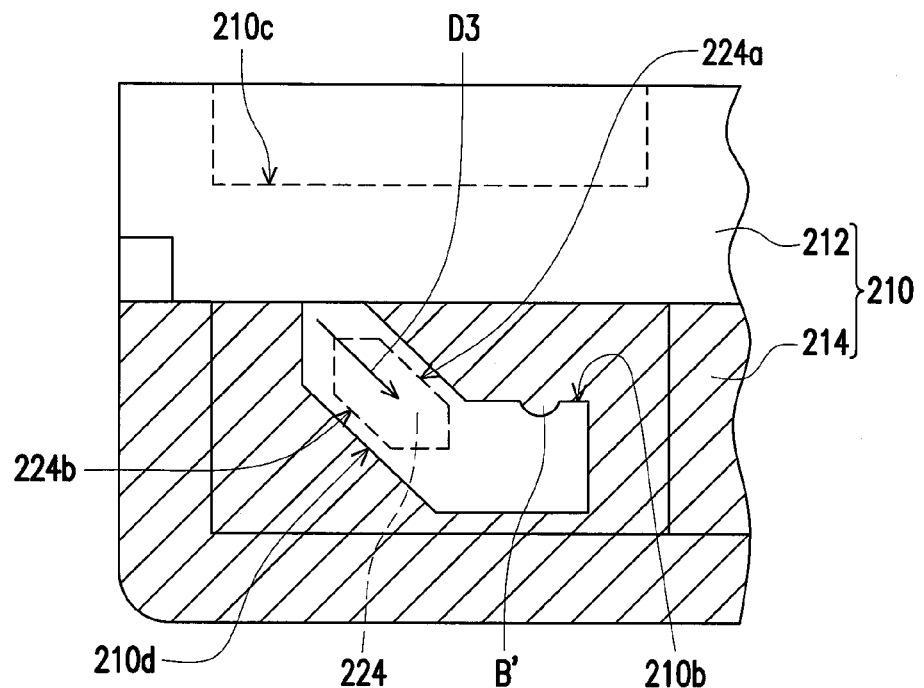
FIG. 8 is a sectional view of an object according to the second embodiment of the disclosure.

FIG. 8 is a sectional view of an object according to the second embodiment of the disclosure. For clarity of the drawing, FIG. 8 only illustrates a bump 224 of a clamping component (it is shown that the bump 224 is located in a guide groove 210d) and does not illustrate the other parts of the clamping component. In an object 210 in FIG. 8, a first component 212, a second component 214, a containing space 210b, a protrusion B' and the bump 224 of the clamping component are arranged and function in manners similar to those of the first component 112, the second component 114, the containing space 110b, the protrusion B and the bump 124 of the clamping component in FIG. 4. Details thereof are thus omitted. The object 210 differs from the object 110 in that the guide groove 210d extends to the containing space 210b along a direction D3 tilted with respect to an upper surface 210c of the object 210, so as to guide the bump 224 of the clamping component to the containing space 210b. More specifically, the bump 224 has an inclined surface 224a and an inclined surface 224b. The inclined surfaces 224a and 224b move along inner walls of the guide groove 210d. In the present embodiment, the inclined surfaces 224a and 224b are, for example, parallel to the extension direction D3 of the guide groove 210d, such that the bump 224 moves smoothly along the guide groove 210d. In other embodiments, the inclined surfaces 224a and 224b may not be parallel to the extension direction D3 of the guide groove 210d, and inclination angles of the inclined surfaces 224a and 224b are, for example, smaller than an inclination angle of the guide groove 210d. The disclosure does not impose any limitation on this.

Referring to FIGS. 3 and 7, in the aforementioned clamping structure 100 (denoted in FIG. 1), the object 110 has a containing recessed portion 110e, and the waterproof elastic component 130 is adapted to be contained in the containing recessed portion 110e, thereby giving a better appearance to the clamping structure 100. In other embodiments, the object may have no containing recessed portion and expose the waterproof elastic component. The disclosure does not impose any limitation on this.

Figure 9:
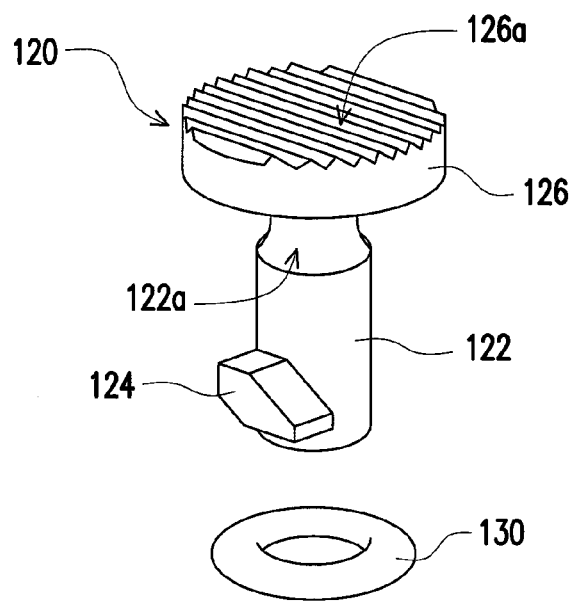
FIG. 9 is a breakdown view of the clamping component and the waterproof elastic component in FIG. 3.

FIG. 9 is a breakdown view of the clamping component and the waterproof elastic component in FIG. 3. In the embodiments shown in FIGS. 3 and 9, the waterproof elastic component 130 has a ring shape and surrounds the pillar 122. The pillar 122 has a position-limiting section (also referred to as ring-shaped groove) 122a. An outer diameter of the position-limiting section 122a is smaller than outer diameters of the other sections of the pillar 122. The waterproof elastic component 130 is position-limited to the position-limiting section 122a and fixed to the pillar 122. When the pillar 122 is inserted into the hole 110a of the object 110, as shown in FIGS. 6A to 6B, the waterproof elastic component 130 moves onto the object 110 with the movement of the pillar 122. In other embodiments, the waterproof elastic component may not be fixed to the clamping component, which will be exemplified hereinafter with reference to drawings.

Figure 10:
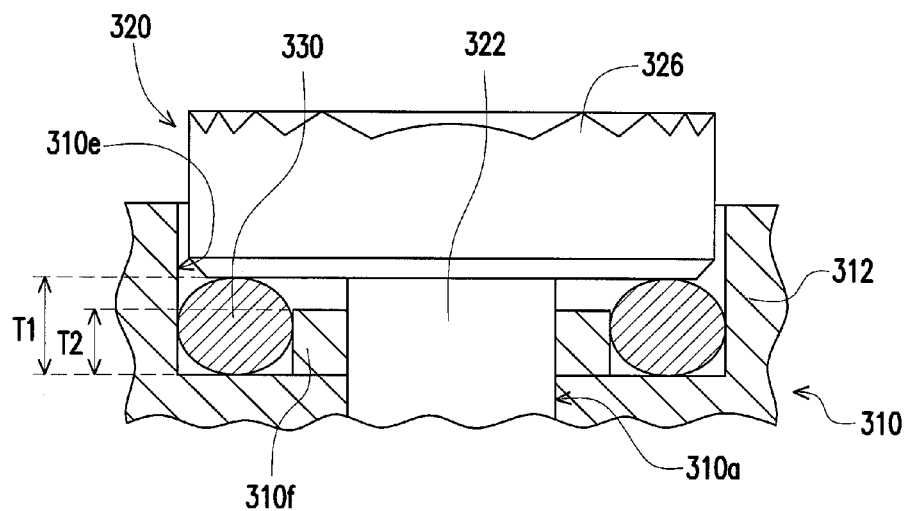
FIG. 10 is a partial sectional view of a clamping structure according to the third embodiment of the disclosure.

FIG. 10 is a partial sectional view of a clamping structure according to the third embodiment of the disclosure. Referring to FIG. 10, in the present embodiment, an object 310, a containing recessed portion 310e, a first component 312, a hole 310a, a clamping component 320, a pillar 322, a head portion 326 and a waterproof elastic component 330 are arranged and function in manners similar to those of the object 110, the containing recessed portion 110e, the first component 112, the hole 110a, the clamping component 120, the pillar 122, the head portion 126 and the waterproof elastic component 130 in FIG. 7. Details thereof are thus omitted. The embodiment shown in FIG. 10 differs from the embodiment shown in FIG. 7 in that the pillar 322 does not have the ring-shaped groove 122a as shown in FIG. 7, and that the waterproof elastic component 330 is not fixed to the pillar 322. Before the clamping component 320 is fastened to the object 310, the waterproof elastic component 330 is adapted to be placed on the object 310. When the pillar 322 of the clamping component 320 is inserted into the hole 310a of the object 310, as shown in FIG. 10, the clamping component 320 compresses the waterproof elastic component 330 on the object 310.

In the embodiment shown in FIG. 10, the object 310 has a position-limiting protruding portion 310f. The position-limiting protruding portion 310f is located in the containing recessed portion 310e, and the waterproof elastic component 330 is position-limited between an inner wall of the containing recessed portion 310e and the position-limiting protruding portion 310f, thereby stably fixing the position of the waterproof elastic component 330. More specifically, a thickness T1 of the waterproof elastic component 330 is, for example, greater than a thickness T2 of the position-limiting protruding portion 310f, such that the head portion 326 of the clamping component 320 smoothly compresses the waterproof elastic component 330. In addition, the waterproof elastic component 330 of the present embodiment may also be designed to be fixed on the clamping component 320, and moves onto the object 310 with movement of the pillar 322. The disclosure does not impose any limitation on this.

Figure 11:
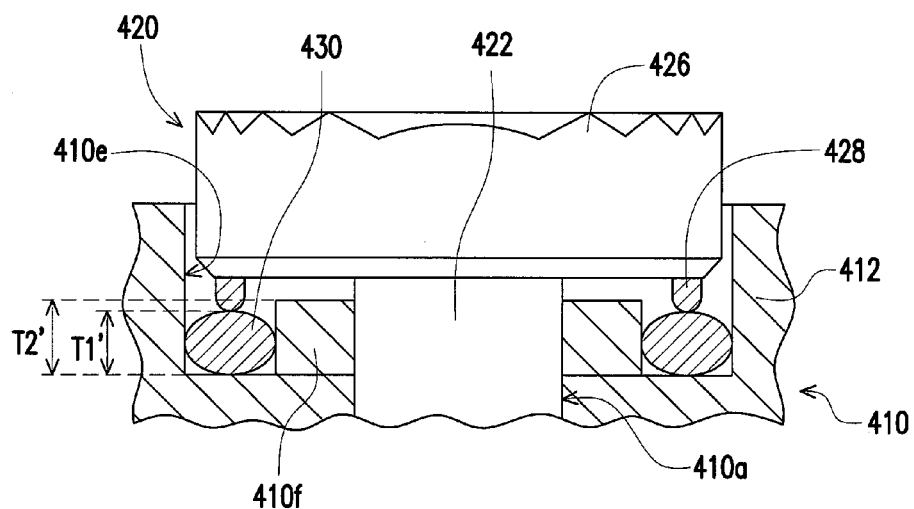
FIG. 11 is a partial sectional view of a clamping structure according to the fourth embodiment of the disclosure.

FIG. 11 is a partial sectional view of a clamping structure according to the fourth embodiment of the disclosure. Referring to FIG. 11, in the present embodiment, an object 410, a containing recessed portion 410e, a first component 412, a hole 410a, a position-limiting protruding portion 410f, a clamping component 420, a pillar 422, a head portion 426 and a waterproof elastic component 430 are arranged and function in manners similar to those of the object 310, the containing recessed portion 310e, the first component 312, the hole 310a, the position-limiting protruding portion 310f, the clamping component 320, the pillar 322, the head portion 326 and the waterproof elastic component 330 in FIG. 10. Details thereof are thus omitted. The embodiment shown in FIG. 11 differs from the embodiment shown in FIG. 10 in that a thickness T1' of the waterproof elastic component 430 is smaller than a thickness T2' of the position-limiting protruding portion 410f. To enable the clamping component 420 to smoothly compress the waterproof elastic component 430, the clamping component 420 of the present embodiment has a protruding edge 428. The protruding edge 428 and the pillar 422 are connected to the same side of the head portion 426. When the clamping component 420 is fastened to the object 410, the protruding edge 428 extends between an inner wall of the containing recessed portion 410e and the position-limiting protruding portion 410f, compressing the waterproof elastic component 430. In addition, the waterproof elastic component 430 of the present embodiment may also be designed to be fixed on the clamping component 420, and moves onto the object 410 with movement of the pillar 422. The disclosure does not impose any limitation on this.

Figure 12:
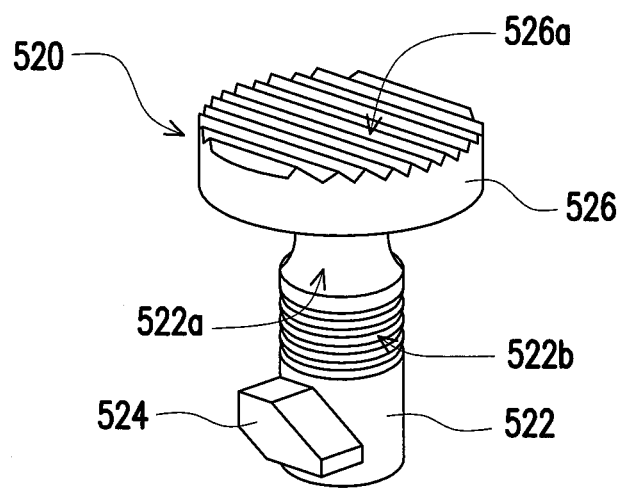
FIG. 12 is a three-dimensional view of a fixing component according to the fifth embodiment of the disclosure.

FIG. 12 is a three-dimensional view of a fixing component according to the fifth embodiment of the disclosure. In a fixing component 520 in FIG. 12, a pillar 522, a ring-shaped groove 522a, a positioning bump 524, a stopping portion 526 and a jagged structure 526a are arranged and function in manners similar to those of the pillar 122, the position-limiting section 122a, the bump 124, the head portion 126 and the sawtooth structure 126a of the clamping component 120 of the first embodiment. Details thereof are thus omitted. The fixing component 520 differs from the clamping component 120 in that the pillar 522 is a threaded structure. Specifically, the pillar 522 has a thread 522b between the ring-shaped groove 522a and the positioning bump 524. When the fixing component 520 is positioned at an object by the positioning bump 524 (in a manner similar to the positioning manner of the bump 124 of the first embodiment, and details thereof are omitted herein), the fixing component 520 is further fixed to the object by the thread 522b. In addition, a waterproof elastic component may be mounted to the ring-shaped groove 522a of the pillar 522 of the fixing component 520 so as to perform waterproofing (in a manner similar to the waterproofing manner of the waterproof elastic component 130 of the first embodiment, and details thereof are omitted herein).

In summary, the waterproof elastic component of the disclosure is compressed between the object (such as a casing of an electronic device) and the head portion of the clamping component, such that the outside liquid is prevented from entering the object by use of the waterproof elastic component. Moreover, the bump of the clamping component is positioned at the containing space of the object by elastic force of the waterproof elastic component, such that the clamping component is fastened to the object. Accordingly, unlike the conventional waterproof screw, the clamping component of the disclosure does not need to be fastened and positioned by screw locking. Moreover, unlike the conventional waterproof screw, the clamping component of the disclosure does not perform waterproofing by a waterproof material coated on the screw. Therefore, the situation that the waterproof material wears due to repeated fastening of the screw does not occur, and thus the clamping structure has good waterproof performance and improved capability of being assembled repeatedly. In addition, since the clamping component of the disclosure is not assembled by screw locking, there is no need to dispose a threaded post on the object by thermal melting for fastening of the clamping component, thus reducing manufacturing costs of the clamping structure. In addition, the head portion of the clamping component may have a sawtooth structure, making it easy for the user to apply force to the sawtooth structure through their fingers to generate friction, such that the friction drives the clamping component to rotate, and thus no additional tool is required for rotating the clamping component. In this way, the assembly of the clamping structure becomes easier and simpler.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A clamping structure, adapted to an electronic device, the clamping structure comprising:
   an object having a hole and a containing space, wherein the containing space is connected to the hole;
   a clamping component comprising a pillar, a bump and a head portion, wherein the bump and the head portion are connected to the pillar, and the pillar is adapted to be inserted into the hole and rotated such that the bump moves to the containing space; and
   an elastic component, wherein when the bump is located in the containing space, the elastic component is compressed between the object and the head portion, and the bump is positioned at the containing space by elastic force of the elastic component, such that the clamping component is fastened to the object.

2. The clamping structure according to claim 1, wherein the object has a containing recessed portion, and the elastic component is adapted to be contained in the containing recessed portion.

3. The clamping structure according to claim 2, wherein the object has a position-limiting protruding portion, the position-limiting protruding portion is located in the containing recessed portion, and the elastic component is position-limited between an inner wall of the containing recessed portion and the position-limiting protruding portion.

4. The clamping structure according to claim 3, wherein a thickness of the elastic component is greater than a thickness of the position-limiting protruding portion.

5. The clamping structure according to claim 3, wherein a thickness of the elastic component is smaller than a thickness of the position-limiting protruding portion, the clamping component has a protruding edge, the protruding edge and the pillar are connected to the same side of the head portion, and when the clamping component is fastened to the object, the protruding edge extends between the inner wall of the containing recessed portion and the position-limiting protruding portion and compresses the elastic component.

6. The clamping structure according to claim 1, wherein the object has an upper surface and a guide groove, the pillar is adapted to be inserted into the hole from the upper surface, the guide groove extends from the upper surface to the containing space, and the bump is adapted to move to the containing space by guidance of the guide groove.

7. The clamping structure according to claim 6, wherein the guide groove comprises a first section and a second section, the first section is connected between the upper surface and the second section and extends along a direction perpendicular to the upper surface, and the second section is connected between the first section and the containing space and extends along a direction parallel to the upper surface.

8. The clamping structure according to claim 6, wherein the guide groove extends to the containing space along a direction tilted with respect to the upper surface.

9. The clamping structure according to claim 6, wherein the bump has at least one inclined surface, and the inclined surface is adapted to move along inner walls of the guide groove.

10. The clamping structure according to claim 1, wherein the elastic component has a ring shape and surrounds the pillar.

11. The clamping structure according to claim 10, wherein the pillar has a position-limiting section, an outer diameter of the position-limiting section is smaller than outer diameters of the other sections of the pillar, and the elastic component is position-limited to the position-limiting section.

12. The clamping structure according to claim 1, wherein the elastic component is a waterproof elastic component.

13. The clamping structure according to claim 1, wherein the containing space has a protrusion therein, and when the bump is located in the containing space, the protrusion prevents the bump from leaving from the containing space.

14. The clamping structure according to claim 1, wherein the elastic component is fixed to the pillar, and when the pillar is inserted into the hole, the elastic component moves onto the object with movement of the pillar.

15. The clamping structure according to claim 1, wherein the elastic component is adapted to be placed on the object, and when the pillar is inserted into the hole, the clamping component compresses the elastic component on the object.

16. The clamping structure according to claim 1, wherein the clamping component is adapted to be inserted into the hole along a direction parallel to a central axis of the pillar, and rotated around the central axis of the pillar to drive the bump to move to the containing space.

17. The clamping structure according to claim 1, wherein the object comprises a first component and a second component, the first component has a first assembly hole, the second component has a second assembly hole, the containing space is located at the second component, the first component leans against the second component such that the first assembly hole and the second assembly hole are aligned with each other to form the hole, and when the clamping component is fastened to the object, the elastic component is compressed between the first component and the head portion, and the head portion prevents the first component from being separated from the second component.

18. The clamping structure according to claim 1, wherein the head portion has a sawtooth structure, and the sawtooth structure is adapted to receive a force to drive the clamping component to rotate.

19. An electronic device, comprising:
a casing having a hole and a containing space, wherein the containing space is connected to the hole;
a clamping component comprising a pillar, a bump and a head portion, wherein the bump and the head portion are connected to the pillar, and the pillar is adapted to be inserted into the hole and rotated such that the bump moves to the containing space; and
an elastic component, wherein when the bump is located in the containing space, the elastic component is compressed between the casing and the head portion, and the bump is positioned at the containing space by elastic force of the elastic component, such that the clamping component is fastened to the casing, wherein the elastic component is a waterproof elastic component.

20. The electronic device according to claim 19, wherein the elastic component is adapted to be placed on the casing, and when the pillar is inserted into the hole, the clamping component compresses the elastic component on the casing, wherein the casing has a containing recessed portion, and the elastic component is adapted to be contained in the containing recessed portion.

21. The electronic device according to claim 20, wherein the casing has a position-limiting protruding portion, the position-limiting protruding portion is located in the containing recessed portion, and the elastic component is position-limited between an inner wall of the containing recessed portion and the position-limiting protruding portion.

22. The electronic device according to claim 21, wherein a thickness of the elastic component is greater than a thickness of the position-limiting protruding portion.

23. The electronic device according to claim 21, wherein a thickness of the elastic component is smaller than a thickness of the position-limiting protruding portion, the clamping component has a protruding edge, the protruding edge and the pillar are connected to the same side of the head portion, and when the clamping component is fastened to the casing, the protruding edge extends between the inner wall of the containing recessed portion and the position-limiting protruding portion and compresses the elastic component.

24. The electronic device according to claim 19, wherein the casing has an upper surface and a guide groove, the pillar is adapted to be inserted into the hole from the upper surface, the guide groove extends from the upper surface to the containing space, and the bump is adapted to move to the containing space by guidance of the guide groove.

25. The electronic device according to claim 24, wherein the guide groove extends to the containing space along a direction tilted with respect to the upper surface.

26. The electronic device according to claim 24, wherein the bump has at least one inclined surface, and the inclined surface is adapted to move along inner walls of the guide groove.

27. The electronic device according to claim 19, wherein the containing space has a protrusion therein, and when the bump is located in the containing space, the protrusion prevents the bump from leaving from the containing space, wherein the elastic component is fixed to the pillar, and when the pillar is inserted into the hole, the elastic component moves onto the casing with movement of the pillar, wherein the elastic component has a ring shape and surrounds the pillar.

28. The electronic device according to claim 27, wherein the pillar has a position-limiting section, an outer diameter of the position-limiting section is smaller than outer diameters of the other sections of the pillar, and the elastic component is position-limited to the position-limiting section.

29. The electronic device according to claim 19, wherein the clamping component is adapted to be inserted into the hole along a direction parallel to a central axis of the pillar, and rotated around the central axis of the pillar to drive the bump to move to the containing space, wherein the casing comprises a first component and a second component, the first component has a first assembly hole, the second component has a second assembly hole, the containing space is located at the second component, the first component leans against the second component such that the first assembly hole and the second assembly hole are aligned with each other to form the hole, and when the clamping component is fastened to the casing, the elastic component is compressed between the first component and the head portion, and the head portion prevents the first component from being separated from the second component, wherein the head portion has a sawtooth structure, and the sawtooth structure is adapted to receive a force to drive the clamping component to rotate.

30. A fixing component, comprising:
a pillar;
a stopping portion connected to the pillar, wherein an outer diameter of the stopping portion is greater than an outer diameter of the pillar;

a positioning bump connected to the pillar, wherein the fixing component is adapted to be rotated around a central axis of the pillar to change a position of the positioning bump; and a waterproof elastic component surrounding the pillar, wherein the pillar has a ring-shaped groove, an outer diameter of the ring-shaped groove is smaller than outer diameters of the other sections of the pillar, and the waterproof elastic component is position-limited to the ring-shaped groove.

31. The fixing component according to claim 30, having a protruding edge, wherein the protruding edge and the pillar are connected to the same side of the stopping portion.

32. The fixing component according to claim 30, wherein the stopping portion has a jagged structure, and the jagged structure is adapted to receive a force to drive the fixing component to rotate.

33. The fixing component according to claim 30, wherein the pillar is a threadless structure.

34. The fixing component according to claim 30, wherein the pillar is a threaded structure.

* * * * *